Oct. 1, 1968 J. H. SCOTT, JR 3,404,073

METHOD OF FORMING ALIGNED OXIDE PATTERNS ON OPPOSITE SURFACES OF A WAFER OF SEMICONDUCTOR MATERIAL

Filed Sept. 15, 1965

INVENTOR.

JOSEPH H. SCOTT, JR.

BY

Glenn H. Bramle

ATTORNEY

United States Patent Office 3,404,073

Patented Oct. 1, 1968

3,404,073

METHOD OF FORMING ALIGNED OXIDE PATTERNS ON OPPOSITE SURFACES OF A WAFER OF SEMICONDUCTOR MATERIAL

Joseph H. Scott, Jr., Newark, N.J., assignor to Radio Corporation of America, a corporation of Delaware Filed Sept. 15, 1965, Ser. No. 487,427

3 Claims. (Cl. 204—15)

ABSTRACT OF THE DISCLOSURE

A method of forming aligned oxide patterns simultaneously on the opposite major surfaces of a wafer of semiconductor material comprises the steps of (1) immersing the wafer in an electrolyte, (2) biasing the wafer with a postive voltage relative to a cathode electrode in the electrolyte, (3) providing a potential difference between the opposite major surfaces of the wafer, and (4) directing a light image of the pattern to be formed onto one of the major surfaces of the wafer.

This invention relates generally to semiconductor devices, and more particularly to an improved method of forming aligned oxide patterns on the opposite major surfaces of a wafer of semiconductor material. The improved method is especially useful in making certain semiconductor devices that require manufacturing operations be performed on both of the opposite major surfaces of a wafer of semiconductor material.

In the manufacture of many semiconductor devices, some of the operations in the manufacturing process must be performed on both of the major surfaces of a semiconductor wafer. Means have been provided to align portions on the opposite major surfaces of the wafer. Special jigs and marking means have been used for this purpose, but their cost, application, and accuracy in some cases leave something to be desired.

It is an object of the present invention to provide an improved method of forming aligned oxide patterns simply and accurately on the opposite major surfaces of a wafer of semiconductor material.

Briefly stated, the improved method of forming aligned oxide patterns on the opposite major surfaces of a wafer of semiconductive material, in one embodiment, comprises the operations of (1) immersing the wafer of semiconductor material in an electrolyte, (2) biasing the wafer with a positive voltage relative to a cathode in the electrolyte, and (3) directing a light image of the patterns to be formed onto one of the major surfaces of the wafer. Under these conditions, an oxide pattern forms not only on the light-exposed major surface but also on the opposite major surface of the wafer, and both of the patterns are in substantial alignment with each other. In another embodiment, the improved method comprises, in addition, providing a potential difference between the opposite major surfaces of the wafer.

While the improved method will be described, for illustrative purposes, in the manufacture of alloy-junction transistors, it may be used for the manufacture of many other types of semiconductor devices that require operations on opposite surfaces of a wafer of semiconductor material.

The novel features of the present invention, as well as additional objects and advantages thereof, will be more readily understood from the following description, when read in connection with the accompanying drawing, in which similar reference characters represent similar parts throughout, and in which.

Figures 1, 2, 3, 4, 5, 6, 7:
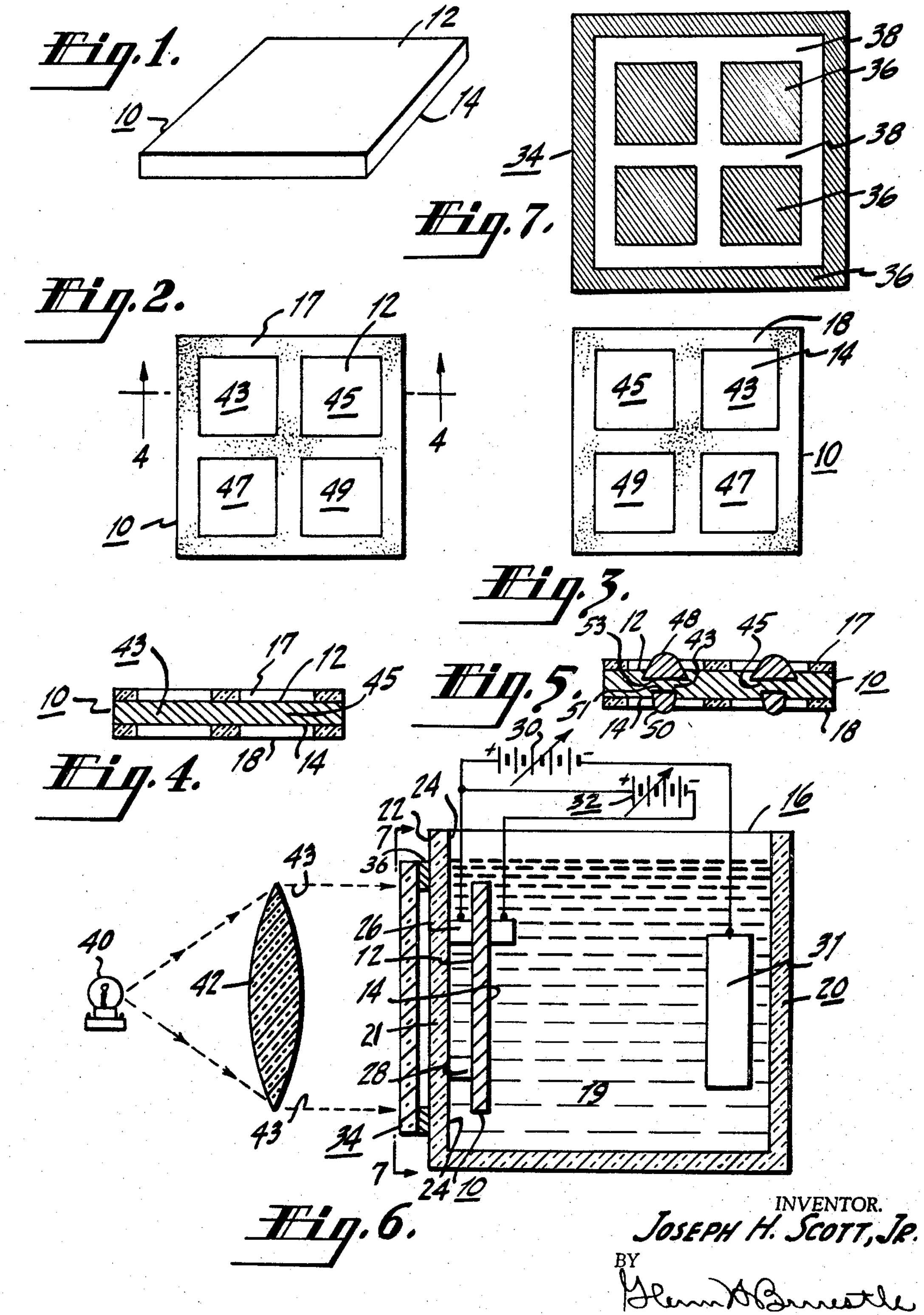
FIG. 1 is a perspective view of a wafer of semiconductor material used in the manufacture of semiconductor devices by the improved method.
FIGS. 2 and 3 are top and bottom views, respectively, of the wafer illustrated in FIG. 1, showing aligned oxide patterns thereon.
FIG. 4 is a cross-sectional view of the wafer in FIG. 2, taken along the line 4—4 thereof.
FIG. 5 is a cross-sectional view similar to that of FIG. 4, showing aligned alloy-junctions in the semiconductor wafer.
FIG. 6 is a side elevational view, partly schematic and partly in cross-section, of apparatus for carrying out the improved method of forming aligned oxide patterns on the opposite major surfaces of the wafer illustrated in FIG. 1.
FIG. 7 is a sectional view of a mask, taken along the line 7—7 in FIG. 6, used in the improved method.

Referring now particularly to FIG. 1 of the drawing, there is shown a sheet of semiconductor material, such as a wafer 10 of silicon or germanium. The wafer 10 may be circular or rectangular, as illustrated, and is formed from a single crystal of suitably doped semiconductor material. The wafer 10, in the example used herein, is N-type silicon having a thickness between 5 and 15 mils, an area of about 1 square inch, and a resistivity between 10 and 30 ohm-cm.

The wafer 10 may be used in the manufacture of a plurality of alloy-junction transistors by alloying suitable collector and emitter impurities into the opposite major surfaces 12 and 14, respectively, of the wafer 10. It is important, however, to have guidance patterns on the opposite major surfaces 12 and 14 of the wafer 10 so that the collector and emitter impurities may be properly disposed for each of the transistors to be formed. Aligned oxide patterns formed by the improved method provide excellent guidance means for this purpose.

In one embodiment of the invention, aligned oxide patterns 17 and 18 are formed on the opposite surfaces 12 and 14, respectively, of the wafer 10, as shown in FIGS. 2, 3 and 4. The aligned oxide patterns 17 and 18 provide a grid-like structure that defines aligned unoxidized portions on the opposite surfaces 12 and 14 of the wafer 10 to which suitable impurities may be applied to form alloy-junction transistors, such as the two transistors shown in FIG. 5, which will be described hereinafter in greater detail.

Referring now to FIG. 6, there is shown apparatus 16 for forming the aligned oxide patterns 17 and 18 on the opposite major surfaces 12 and 14, respectively, of the wafer 10. The wafer 10 is immersed in an electrolyte 19 contained in a container 20. The container 20 may have a rectangular cross-section, and at least one wall 21 thereof should be transparent and have optically flat outer and inner surfaces 22 and 24, respectively.

The electrolyte 19 may comprise a dilute aqueous solution of a compound having an anion containing oxygen, such as a dilute (10% to 20%) solution of potassium nitrate, a dilute (1%) solution of sodium sulfate, a dilute (10%) solution of sodium nitrate, or dilute nitric acid, for example. The wafer 10 should be completely immersed in the electrolyte 19 with the major surface 12 substantially parallel to, and spaced from, the inner surface 24 of the wall 21. The opposite major surfaces 12 and 14 of the wafer 10, on which the aligned oxide patterns are to be formed, should be wetted by the electrolyte 19. Suitable spacers, such as spacers 26 and 28 of material (e.g. carbon) inert in the electrolyte 19, may be used to space the wafer 10 slightly from the wall 21.

The wafer 10 is biased with a positive voltage with respect to a cathode electrode 31 in the electrolyte 19. To this end, the negative terminal of a source 30 of unidirectional voltage is connected to a platinum electrode 31, the latter being immersed in the electrolyte 19; and the positive terminal of the voltage source 30 is connected to the wafer 10. If the spacer 26 is of electrically conductive material, such as carbon, the positive terminal of the voltage source 30 may be connected to it. The voltage source 30 may be variable within the range between 24 and 120 volts.

The major surface 12 may be biased positively with respect to the major surface 14 by a source 32 of unidirectional voltage. To this end, the negative terminal of the voltage source 32 is electrically connected to the major surface 14, preferably to a portion of the surface 14 where no oxide pattern is desired; and the positive terminal of the voltage source 32 is connected to the major surface 12, also at a portion of the surface where no oxide pattern is desired. The voltage source 32 should be variable and adapted to provide a voltage in the range between 6 and 24 volts.

A mask 34, such as a glass photographic negative, is formed with a photographic pattern of opaque portions 36 and light-transmitting portions 38, as shown in FIG. 7. The light-transmitting portions 38 provide means for projecting a light image of the oxide patterns to be formed on the opposite major surfaces 12 and 14 of the wafer 10. The mask 34 is disposed against the front surface 22 of the wall 21 with its opaque portions 36 against the surface 22, whereby a light image of the light-transmitting portions 38 of the mask 34 can be directed upon the major surface 12 of the wafer 10, as shown in FIG. 6.

Means are provided to expose the major surface 12 of the wafer 10 with an image of the light-transmitting portions 38 of the mask 34. To this end, a source 40 of light, such as an incandescent lamp, is disposed to direct light through a collimating optical system, illustrated in FIG. 6 merely for illustrative purposes by a single lens 42. Thus, a bundle of parallel rays 43 of light from the optical system 42 are directed through the mask 34 to expose the major surface 12 of the wafer 10 with the light image of the oxide patterns 17 and 18 (FIGS. 2 and 3) to be formed. The thickness of the oxide patterns 17 and 18 grown, or formed, depends upon the amplitude of voltage of the wafer 10 with respect to the electrode 31, the thickness of the wafer 10, the amplitude of the voltage between the major surfaces 12 and 14, the concentration and type of electrolyte 19, the intensity of the light image exposed on the major surface 12, and the time of exposure. For example, an oxide pattern of about 1000 A. in thickness can be formed on a 10 mil thick wafer 10 of silicon in about 10 minutes if the wafer 10 is biased positively 50 volts and the electrolyte 19 is about a 10% solution of sodium nitrate.

The oxide patterns 17 and 18 formed are of silicon dioxide (on a silicon wafer 10) and they are in substantially perfect alignment with each other.

The voltage source 32 is not necessary to the formation of aligned oxide patterns 17 and 18, but its use increases the sharpness and speed of formation of the oxide patterns on the major surface 14.

While the oxide patterns 17 and 18 in the embodiment illustrated in FIGS. 2–4 divide the wafer 10 into four unoxidized portions 43, 45, 47, and 49, the oxide patterns 17 and 18 may, in practice, define hundreds of unoxidized portions per square inch of wafer from which semiconductor components or devices may be made.

The aligned oxide patterns 17 and 18 formed by the improved method are actually grown on the opposite major surfaces 12 and 14 by an improved process of anodic oxidation. It is believed that the positively biased wafer 10 attracts the oxygen-bearing, anions (negative ions), such as $NO_3$, for example, of the electrolyte solution 19 to its major surfaces 12 and 14. Light from the source 40 releases holes (and electrons) at the surface of the wafer 10, and the holes (positive charges) neutralize the anions which, in turn, release oxygen. The released oxygen combines with the material of the wafer 10 to form an oxide of silicon or germanium, depending upon the material of the wafer 10.

The holes formed on the major surface 12 of the wafer 10 can move through the thin wafer to the opposite major surface 14, and thereby neutralize the anions from the electrolyte solution 19. The path of the movement of the holes through the wafer 10 is shortened and the speed of movement is increased by the bias applied across the wafer 10 by the voltage source 32. Thus, the voltage source 32 insures that the oxide patterns 17 and 18 will be sharp and in good alignment.

Very good aligned oxide patterns 17 and 18 can be formed on wafers of semiconductor material whose thicknesses are between 5 and 15 mils. Increasing the thickness of the semiconductor wafer increases the path through which holes have to travel from one surface to the other, thereby tending to decrease the sharpness of the oxide pattern formed on the major surface of the wafer remote from the light source.

To make a plurality of alloy-junction transistors from the wafer 10 of N-type silicon, small quantities, "dots" 48 and 50, of a P-type impurity element, such as indium, for example, are placed on the opposing major surfaces 12 and 14, respectively, of each of the unoxidized portions 43, 45, 47, and 49, of the wafer 10. After proper heating, in a manner well known in the art, the impurity "dots" 48 and 50 alloy with the semiconductor material of the wafer 10 to form regions for the emitter and collector junctions 51 and 53, respectively, as shown in FIG. 5. The base connection (not shown) in each transistor may be made to the original N-type material of the semiconductor wafer 10.

Because the oxide patterns 17 and 18 are in alignment with each other, it is only necessary to place an impurity "dot" in the center of each of the opposite major surfaces 12 and 14 of the unoxidized portions 43, 45, 47, and 49 of the wafer 10 to be sure that the emitter and collector junctions 51 and 53, respectively, will be formed in the proper locations in each of the alloy-junction transistors to be made. When a plurality of alloy-junction transistors are formed in the wafer 10, as shown in FIG. 5, the wafer 10 may be scored along the oxide patterns 17 and 18 to separate, that is to sever, each transistor from the other. Thus, the aligned oxide patterns 17 and 18 not only function to locate portions of the wafer 10 upon which operations are to be performed, but also to designate lines where the wafer is to be severed.

While the improved method has been described for forming aligned oxide patterns on an N-type semiconductor wafer, the method may be applied to P-type wafers as well. Also, the values of the voltages applied to the semiconductor wafer are not critical, and the concentration of the electrolyte may be varied over a relatively wide range, the voltage values and concentration of electrolyte used affecting primarily the time of formation of the oxide patterns. Hence, it is desired that the foregoing description be considered merely as illustrative and not in a limiting sense.

What is claimed is:

1. A method of forming aligned oxide patterns on the opposite major surfaces of a semiconductor wafer, said method comprising:

immersing said wafer in an electrolyte, directing a light image of said patterns on one of said major surfaces;

applying a voltage to said wafer that is positive with respect to a cathode in said electrolyte; and biasing said one major surface with a positive voltage with respect to the other of said major surfaces to form said oxide patterns.

2. A method of growing similar aligned oxide patterns on both major surfaces of a wafer of semiconductor material, said method comprising:

immersing said wafer in an electrolyte and wetting said both major surfaces thereof with said electrolyte, exposing one of said major surfaces to a light image of said patterns, biasing said wafer with a positive voltage with respect to a cathode in said electrolyte, and biasing said one major surface positively with respect to the other of said major surfaces of said wafer.

3. A method of producing aligned oxide patterns on opposite major surfaces of a wafer of semiconductor material, said method comprising:

wetting both said major surfaces of said wafer with an electrolyte having anions containing oxygen, disposing a mask substantially parallel to one of said major surfaces of said wafer, said mask being formed to transmit a light image of said patterns, directing light through said mask and onto said one major surface whereby to expose said one surface with a light image of said oxide pattern, and to form holes in said one surface, biasing said wafer with a positive voltage with respect to a cathode in said electrolyte to attract said anions thereto for neutralization by said holes, and biasing said one major surface with a positive voltage with respect to the other said major surfaces, whereby to cause some of said holes to move through said wafer to said other major surface and to neutralize said anions attracted thereto.

References Cited

UNITED STATES PATENTS 3,345,274 10/1967 Schmidt ------------- 204—15

JOHN H. MACK, *Primary Examiner.*

T. TUFARIELLO, *Assistant Examiner.*